US011811293B2

(12) United States Patent
Purohit et al.

(10) Patent No.: US 11,811,293 B2
(45) Date of Patent: Nov. 7, 2023

(54) POWER MODULE FOR A BRUSHLESS MOTOR IN A POWER TOOL

(71) Applicant: Black & Decker Inc., New Britain, CT (US)

(72) Inventors: Madhur M. Purohit, Towson, MD (US); Michael D. Grove, Windsor, PA (US); Joel D. Sayles, Perry Hall, MD (US)

(73) Assignee: BLACK & DECKER, INC., New Britain, CT (US)

(*) Notice: Subject to any disclaimer, the term of this patent is extended or adjusted under 35 U.S.C. 154(b) by 780 days.

(21) Appl. No.: 16/740,834

(22) Filed: Jan. 13, 2020

(65) Prior Publication Data

US 2020/0227975 A1 Jul. 16, 2020

Related U.S. Application Data

(60) Provisional application No. 62/792,643, filed on Jan. 15, 2019.

(51) Int. Cl.
H02K 7/14 (2006.01)
H02K 11/215 (2016.01)
(Continued)

(52) U.S. Cl.
CPC .............. H02K 7/14 (2013.01); H02K 7/145 (2013.01); H02K 9/00 (2013.01); H02K 9/227 (2021.01);
(Continued)

(58) Field of Classification Search
CPC . H02K 7/14; H02K 5/15; H02K 11/33; H02K 29/08; H02K 29/06; H02K 29/12;
(Continued)

(56) References Cited

U.S. PATENT DOCUMENTS

2010/0320880 A1* 12/2010 Kamogi ................. H02K 11/33
310/68 B
2014/0361645 A1* 12/2014 Beyerl .................... H02K 11/33
310/50
(Continued)

FOREIGN PATENT DOCUMENTS

DE 102015210802 A1 12/2016
EP 3166213 A2 5/2017
(Continued)

OTHER PUBLICATIONS

Sanso Electric, Mounting Base for Hall Elements, Dec. 13, 1994, Sanso Electric, JP H0686350 (English Machine Translation) (Year: 1994).*
(Continued)

Primary Examiner — Alexander A Singh

(57) ABSTRACT

A power module for driving a motor is provided including a power circuit board, power switches operatively connected to the motor disposed on a first side of the circuit board, and positional sensors disposed on a side surface of the power circuit board facing the motor. The power circuit board includes a thermally-conductive core carrier layer, a first electrically-insulating layer disposed on a first surface of the core carrier layer and on which the power switches are mounted, and a second electrically-insulating layer disposed on a second surface of the core carrier layer and on which the positional sensors are mounted. The second electrically-insulating layer is etched to expose the conductive core layer on at least approximately 70% of a surface area of the second side of the circuit board.

15 Claims, 13 Drawing Sheets

(51) Int. Cl.
*H02K 11/33* (2016.01)
*H02K 9/00* (2006.01)
*H05K 7/20* (2006.01)
*H02K 9/22* (2006.01)

(52) U.S. Cl.
CPC ........... *H02K 11/215* (2016.01); *H02K 11/33* (2016.01); *H05K 7/209* (2013.01)

(58) Field of Classification Search
CPC ........ H02K 7/145; H02K 9/227; H02K 5/225; H02K 11/20; H02K 11/21; H02K 11/215; H02K 9/00; B25F 5/008; B25F 5/00
USPC .......................................... 310/68 B, 68 R, 64
See application file for complete search history.

(56) References Cited

U.S. PATENT DOCUMENTS

| | | | |
|---|---|---|---|
| 2017/0106521 A1* | 4/2017 | Kelleher | B24B 23/028 |
| 2017/0110946 A1* | 4/2017 | Oktavec | B24B 23/028 |
| 2018/0262092 A1* | 9/2018 | Beyerl | H02K 11/215 |
| 2020/0313511 A1* | 10/2020 | Murui | B25B 21/02 |

FOREIGN PATENT DOCUMENTS

| | | | |
|---|---|---|---|
| EP | 3292959 A1 | | 3/2018 |
| GB | 2092834 A | | 8/1982 |
| JP | H0686350 | * | 12/1994 |
| WO | 2016009133 A1 | | 1/2016 |
| WO | 2018003013 A1 | | 1/2018 |
| WO | 2018016839 A1 | | 1/2018 |

OTHER PUBLICATIONS

EP ESR dated, May 26, 2020 in corresponding EP application No. 20151483.3.
EP EESR dated, Jun. 8, 2020 in corresponding EP application No. 20151483.3.
Eiger Gordon et al., LED Matrix light source for adaptive driving beam applications, dated May 28, 2013.

* cited by examiner

POWER MODULE FOR A BRUSHLESS MOTOR IN A POWER TOOL

CROSS-REFERENCE TO RELATED APPLICATION

This application claims the benefit of U.S. Provisional Application No. 62/792,643 filed Jan. 15, 2019, which is incorporated herein by reference in its entirety.

FIELD OF THE DISCLOSURE

This disclosure relates to a power module for a brushless motor, and more particularly to an efficient combined power and positional sensor module for powering a brushless DC motor in a power tool.

BACKGROUND

Cordless power tools provide many advantages to traditional corded power tools. In particular, cordless tools provide unmatched convenience and portability. An operator can use a cordless power tool anywhere and anytime, regardless of the availability of a power supply. In addition, cordless power tools provide increased safety and reliability because there is no cumbersome cord to maneuver around while working on the job, and no risk of accidently cutting a cord in a hazardous work area.

However, conventional cordless power tools still have their disadvantages. Typically, cordless power tools provide far less power as compared to their corded counterparts. Today, operators desire power tools that provide the same benefits of convenience and portability, while also providing similar performance as corded power tools.

Brushless DC (BLDC) motors have been used in recent years in various cordless power tools. While BLDC motors provide many advantages over universal and permanent magnet DC motors, challenges exist in incorporating BLDC motors into many power tools depending on power requirements and specific applications of tool. The power components needed for driving the BLDC motors in high power applications have conventionally generated too much heat, making BLDC motors unfeasible for high-power power tools. This is particularly true for tools used in environments where dust and particulate from the workpiece is abundant, making it difficult to create a clean air flow within the tool to cool the motor and associated components. These challenges need be addressed.

Furthermore, high power applications typically require larger motors. As power tools have become more ergonomically compact, it has become more desirable to reduce the size of the motor while providing the required power output.

SUMMARY

According to an embodiment of the invention, a power tool is provided including a tool housing and a brushless DC (BLDC) motor disposed within the tool housing, the motor including a stator assembly and a rotor assembly rotatably interacting with the stator assembly. A power module for driving the motor is provided including a power circuit board, power switches operatively connected to the motor disposed on a first side of the circuit board, and positional sensors disposed on a side surface of the power circuit board facing the motor. The power circuit board includes a thermally-conductive core carrier layer, a first electrically-insulating layer disposed on a first surface of the core carrier layer and on which the power switches are mounted, and a second electrically-insulating layer disposed on a second surface of the core carrier layer and on which the positional sensors are mounted. In an embodiment, the second electrically-insulating layer is etched to expose the conductive core layer on at least approximately 70% of a surface area of the second side of the circuit board.

In an embodiment, the power circuit board further includes terminals disposed on a peripheral side thereof, the second electrically-insulating layer covering an area extending from at least the positional sensors and the terminals.

In an embodiment, the power circuit board includes a central through-hole, the power switches are disposed equidistantly around the central through-hole, and the positional sensors are disposed circumferentially around the central through-hole.

In an embodiment, the core carrier layer has a thickness of at least approximately 1 mm and the first and second electrically-insulating layers each have a thickness of approximately 0.05 to 0.2 mm.

In an embodiment, the power module further includes a clamping heat sink having a main body disposed over the power switches and legs extending around the power circuit board and mounted to the motor.

In an embodiment, an overmold layer is formed between the power circuit board and the clamping heat sink. In an embodiment, the overmold layer further covers metal routings between the positional sensors on the second surface of the core carrier layer.

In an embodiment, the first electrically-insulating layer is not etched, but the second electrically-insulating layer is etched to expose the conductive core layer only on the second side of the circuit board.

According to another embodiment of the invention, a power tool is provided including a tool housing and a brushless DC (BLDC) motor disposed within the tool housing, the motor including a stator assembly and a rotor assembly rotatably interacting with the stator assembly. A power module for driving the motor is provided including: a power circuit board having a central through-hole; power switches operatively connected to the motor disposed on a first surface of the circuit board around the central through-hole; a positional sensor board mounted on a second surface of the circuit board facing the motor, the positional sensor board having a main body formed around the central through-hole; and positional sensors mounted on the positional sensor board facing the motor.

In an embodiment, a planar heat sink to which the power circuit board is secured is provided. In an embodiment, the planar heat sink includes a through-hole having a larger inner diameter than the central through-hole of the power circuit board. In an embodiment, the main body of the positional sensor board includes an outer diameter sized to be fitted within the through-hole of the planar heat sink.

In an embodiment, the main body of the positional sensor board includes an inner diameter that is approximately equal to a diameter of the central through-hole of the power circuit board.

In an embodiment, the main body of the positional sensor board includes a C-shaped profile.

In an embodiment, the positional circuit board is supported at a distance from the second surface of the circuit board via a plurality of legs.

BRIEF DESCRIPTION OF THE DRAWINGS

In the accompanying drawings which form part of the specification.

Corresponding reference numerals indicate corresponding parts throughout the several figures of the drawings.

DETAILED DESCRIPTION

Figure 1:
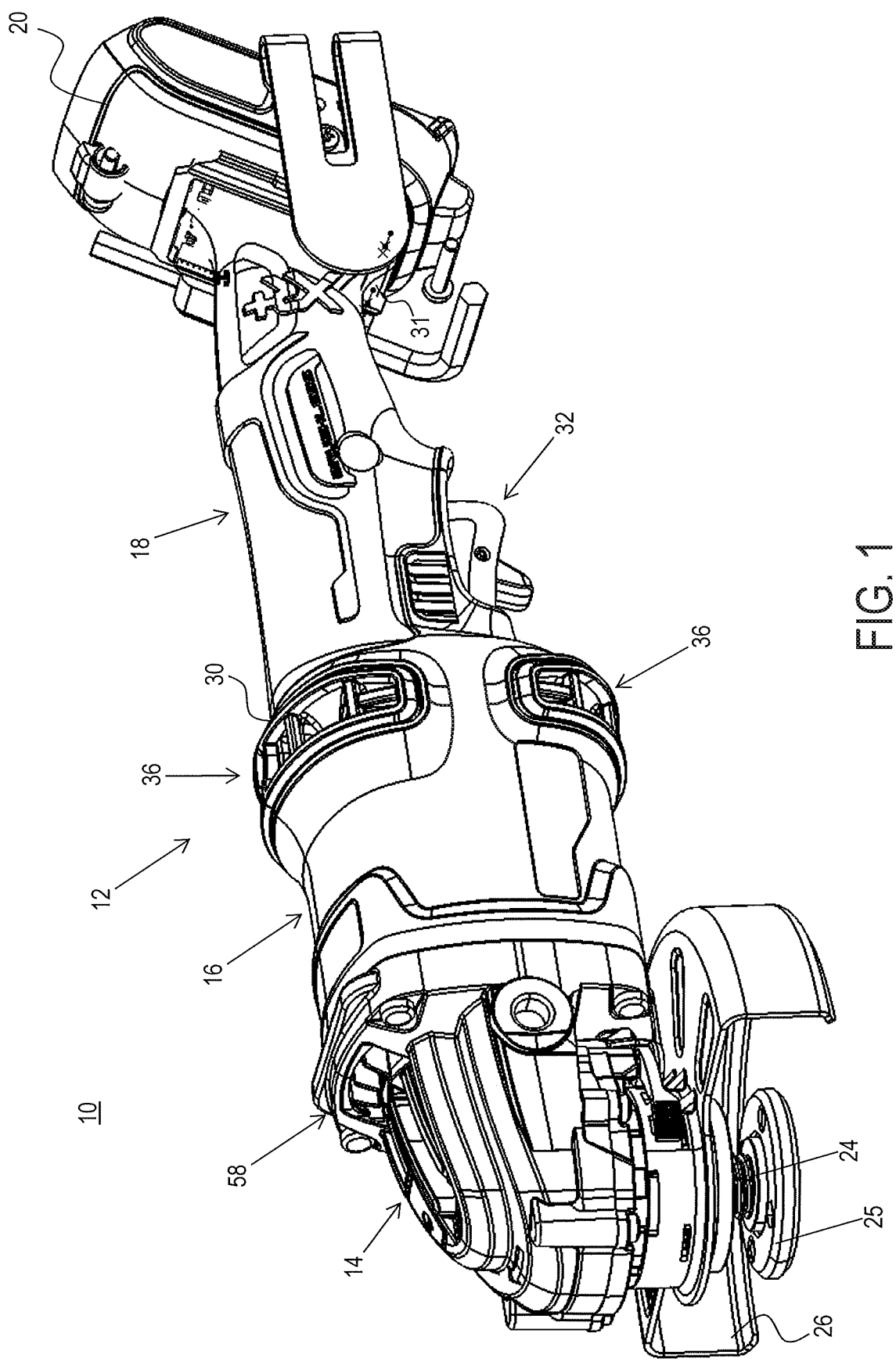
FIG. 1 is a front perspective view of a power tool, in accordance with an embodiment.

The following description illustrates the claimed invention by way of example and not by way of limitation. The description clearly enables one skilled in the art to make and use the disclosure, describes several embodiments, adaptations, variations, alternatives, and uses of the disclosure, including what is presently believed to be the best mode of carrying out the claimed invention. Additionally, it is to be understood that the disclosure is not limited in its application to the details of construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

Figure 2:
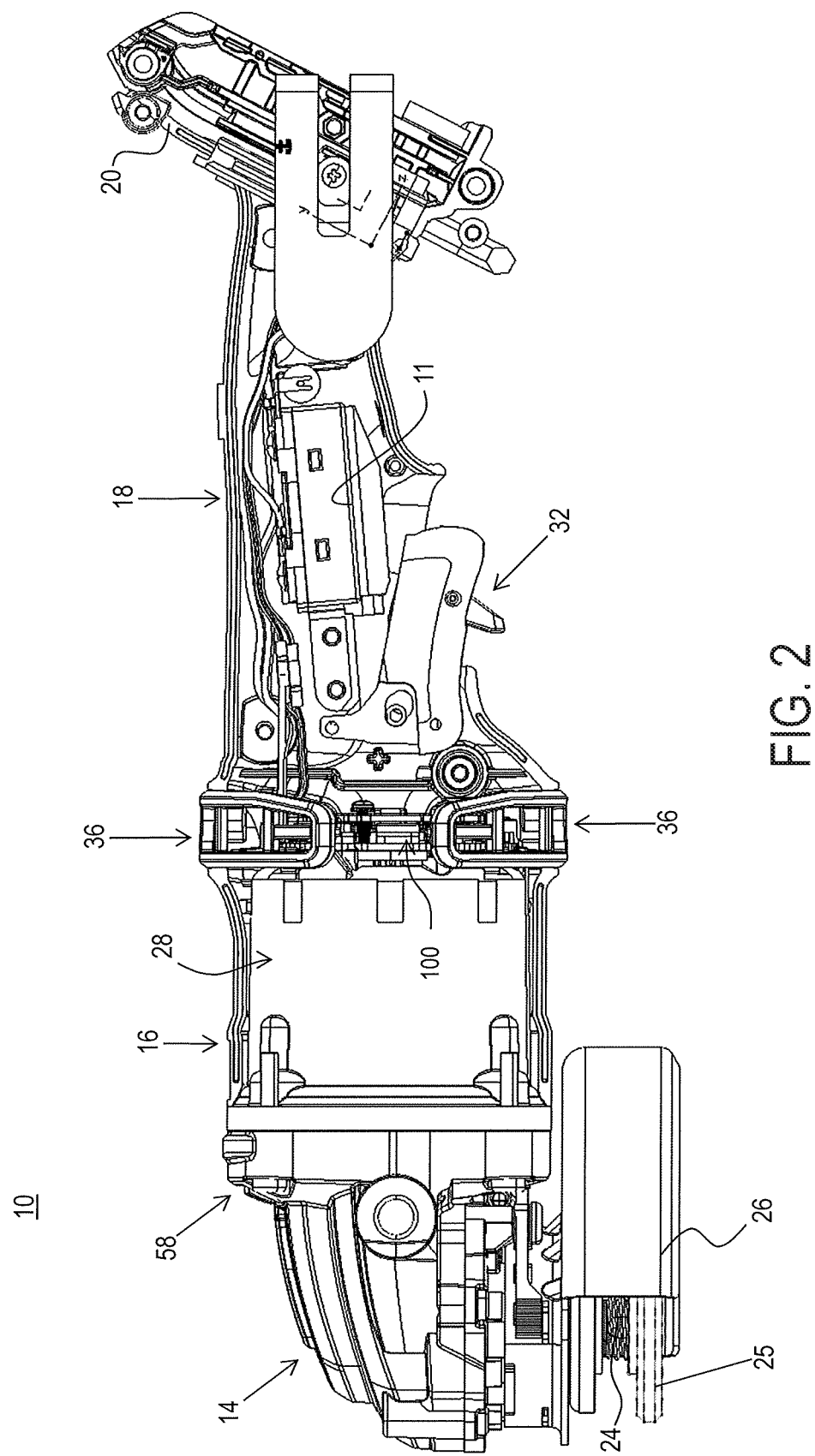
FIG. 2 is a side view of the power tool partially showing internal components of the power tool, in accordance with an embodiment.
Figure 3:
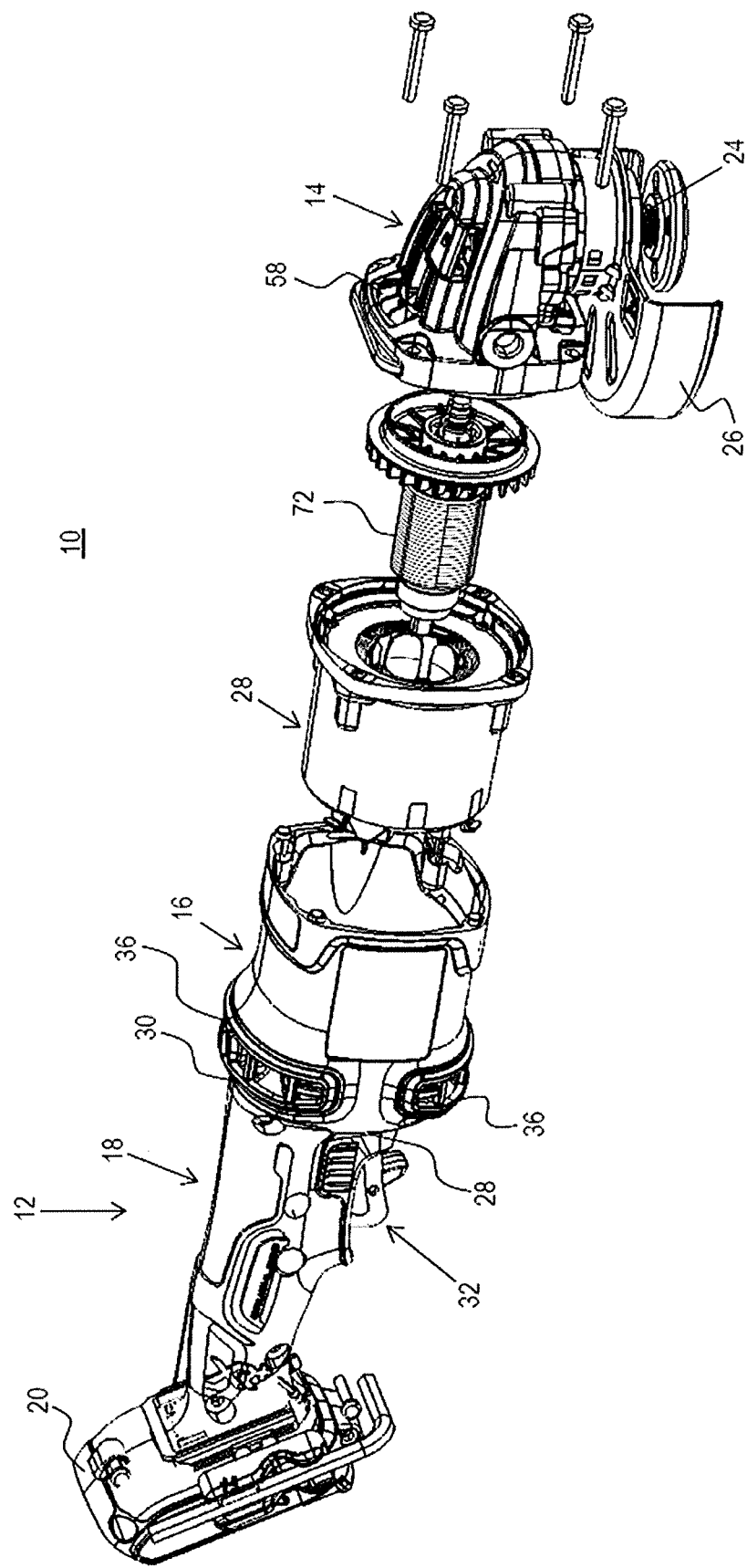
FIGS. 3 and 4 depict front and rear perspective exploded view of the power tool, in accordance with an embodiment.
Figure 4:
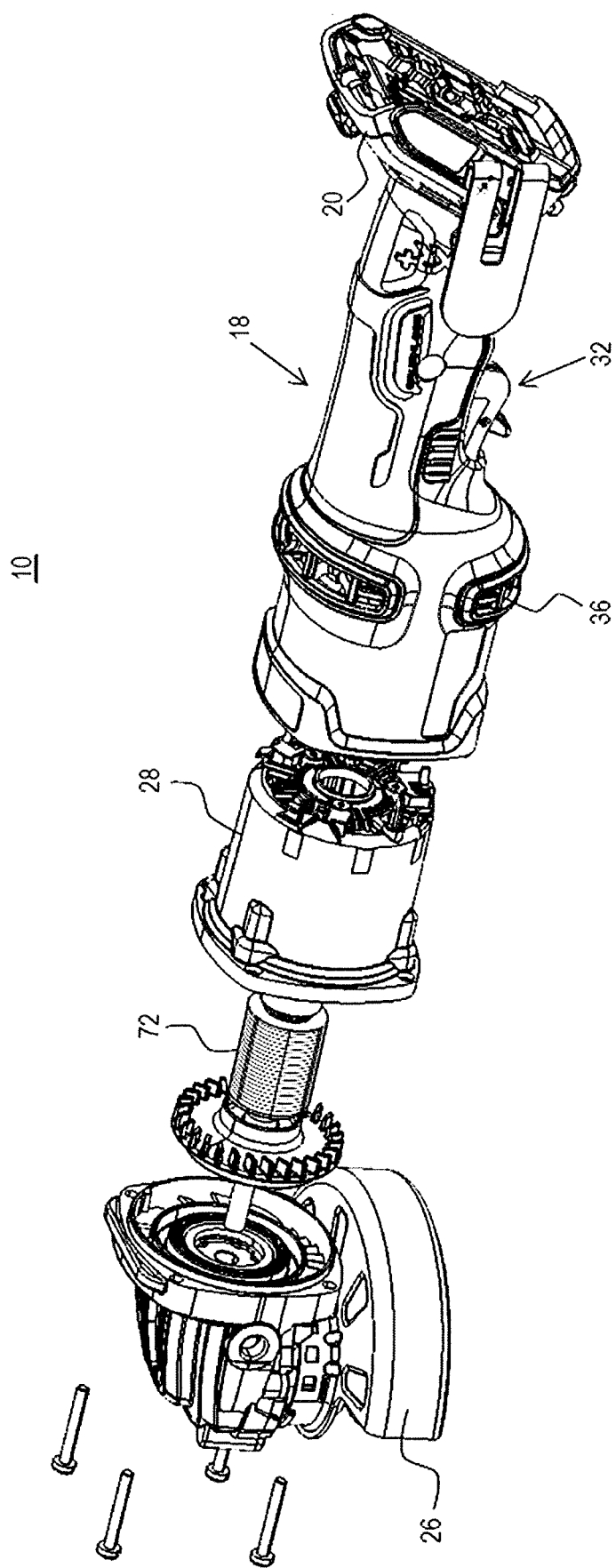

As shown in FIGS. 1-4, according to an embodiment of the invention, a power tool 10 is provided including a housing 12 having a gear case 14, a motor case 16, a handle portion 18, and a battery receiver 20. FIG. 1 provides a perspective view of the tool 10. FIG. 2 provides a side view of tool 10 including its internal components. FIGS. 3 and 4 depict two exploded views of tool 10. Power tool 10 as shown herein is an angle grinder with the gear case 14 housing a gearset (not shown) that drives a spindle 24 arranged to be coupled to a grinding or cutting disc (not shown) via a flange (or threaded nut) 25 and guarded by a disc guard 26. It should be understood, however, that the teachings of this disclosure may apply to any other power tool including, but not limited to, a saw, drill, sander, and the like.

In an embodiment, the motor case 16 attaches to a rear end of the gear case 14 and houses a motor 28 operatively connected to the gear set 22. The handle portion 18 attaches to a rear end 30 of the motor case 16 and includes a trigger assembly 32 operatively connected to a control module 11 disposed within the handle portion 18 for controlling the operation of the motor 28. The battery receiver 20 extends from a rear end 31 of the handle portion 18 for detachable engagement with a battery pack (not shown) to provide power to the motor 28. The control module 11 is electronically coupled to a power module 100 disposed substantially adjacent the motor 28. The control module 11 controls a switching operation of a series of power switches disposed in the power module 100 to regulate a supply of power from the battery pack to the motor 28. The control module 11 uses the input from the trigger assembly 32 to control the switching operation of the power module 100. In an exemplary embodiment, the battery pack may be a 60 volt max lithium-ion type battery pack, although battery packs with other battery chemistries, shapes, voltage levels, etc. may be used in other embodiments.

In various embodiments, the battery receiver 20 and battery pack may be a sliding pack disclosed in U.S. Pat. No. 8,573,324, hereby incorporated by reference. However, any suitable battery receiver and battery back configuration, such as a tower pack or a convertible 20V/60V battery pack as disclosed in U.S. patent application Ser. No. 14/715,258 filed May 18, 2015, also incorporated by reference, can be used. The present embodiment is disclosed as a cordless, battery-powered tool. However, in alternate embodiments power tool can be corded, AC-powered tools. For instance, in place of the battery receiver and battery pack, the power tool 10 include an AC power cord coupled to a transformer block to condition and transform the AC power for use by the components of the power tools. Power tool 10 may for example include a rectifier circuit adapted to generate a positive current waveform from the AC power line. An example of such a tool and circuit may be found in US Patent Publication No. 2015/0111480, filed Oct. 18, 2013, which is incorporated herein by reference in its entirety.

Referring to FIG. 2, the trigger assembly 32 is a switch electrically connected to the control module 11 as discussed above. The trigger assembly 32 in this embodiment is an ON/OFF trigger switch pivotally attached to the handle 18. The trigger 32 is biased away from the handle 18 to an OFF position. The operator presses the trigger 32 towards the handle to an ON position to initiate operation of the power tool 10. In various alternate embodiments, the trigger assembly 32 can be a variable speed trigger switch allowing the operator to control the speed of the motor 28 at no-load, similar to variable-speed switch assembly disclosed in U.S. Pat. No. 8,573,324, hereby incorporated by reference. However, any suitable input means can be used including, but not limited to a touch sensor, a capacitive sensor, or a speed dial.

Figure 5:
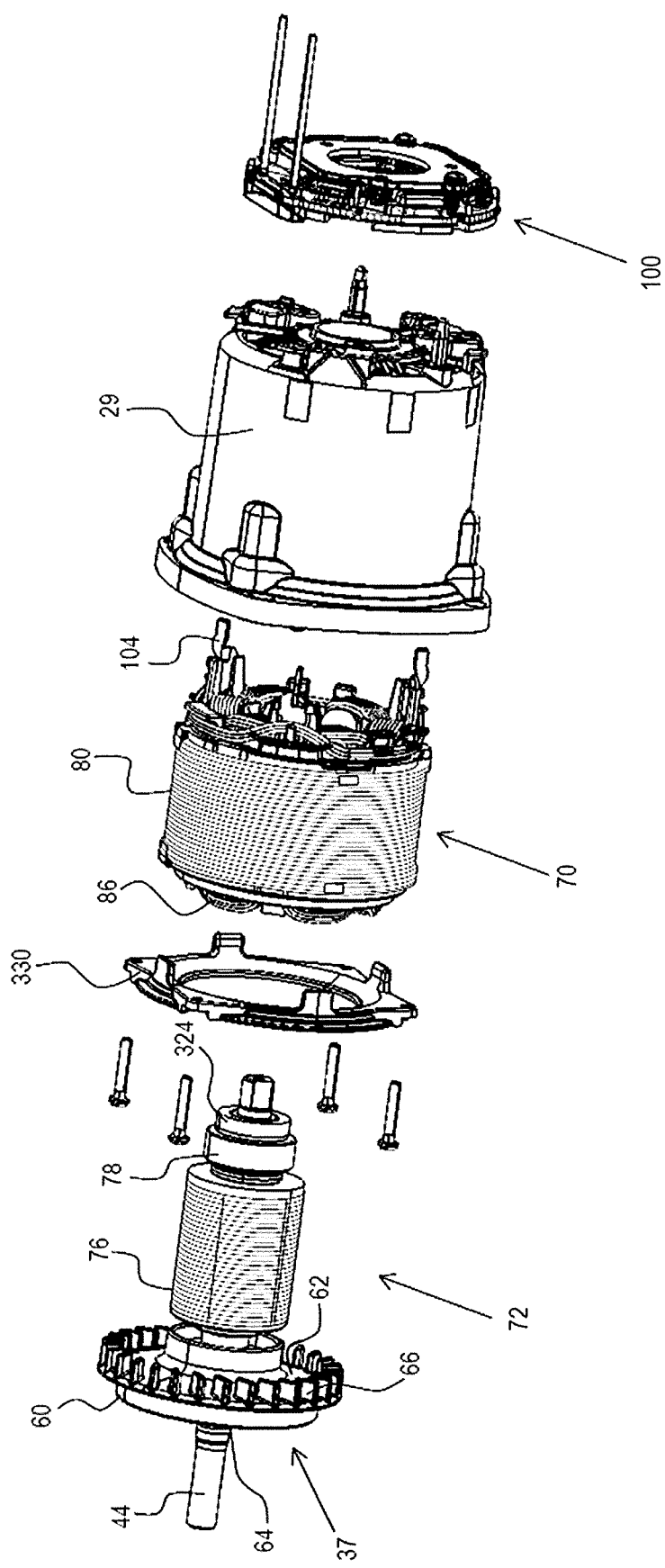
FIG. 5 is a perspective view of the motor assembly, in accordance with an embodiment.
Figure 12:
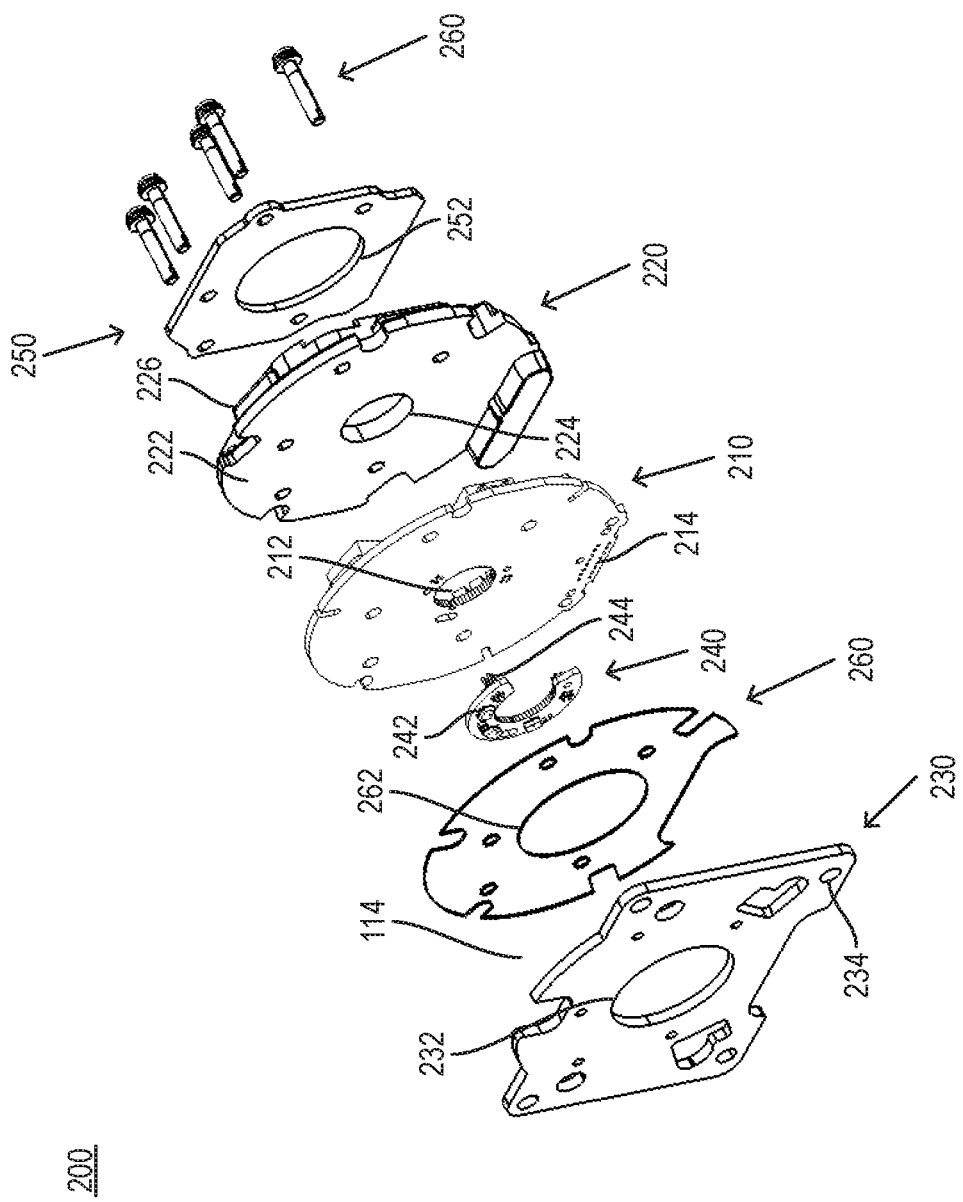
FIGS. 12 and 13 depict perspective exploded views of a power module, in accordance with a second embodiment.

FIG. 5 depicts a perspective view of motor 28, according to an embodiment. FIG. 12 depicts an exploded view of the motor 28, according to an embodiment. As shown in herein, the motor 28 is a three-phase brushless DC (BLDC) motor having a can or motor housing 29 sized to receive a stator assembly 70 and a rotor assembly 72.

In an embodiment, rotor assembly 72 includes a rotor shaft 74, a rotor lamination stack 76 mounted on and rotatably attached to the rotor shaft 74, a rear bearing 78 arranged to axially secure the rotor shaft 74 to the motor housing 29, a sense magnet ring 324 attached to a distal end of the rotor shaft 74, and fan 37 also mounted on and rotatably attached to the rotor shaft 74. In various implementations, the rotor lamination stack 76 can include a series of flat laminations attached together via, for example, an interlock mechanical, an adhesive, an overmold, etc., that house or hold two or more permanent magnets (PMs) therein. The permanent magnets may be surface mounted on the outer surface of the lamination stack 76 or housed therein. The permanent magnets may be, for example, a set of four PMs that magnetically engage with the stator assembly 70 during operation. Adjacent PMs have opposite polarities such that the four PMs have, for example, an N-S-N-S polar arrangement. The rotor shaft 74 is securely fixed inside the rotor lamination stack 76. Rear bearing 78 provide longitudinal support for the rotor 74 in a bearing pocket of the motor housing 29. A sense magnet ring 324 is also disposed on the rotor shaft 44, preferably at an end of the shaft 44, for sensing a rotational position of the rotor assembly 72, as described below in detail.

In an embodiment, fan 37 of the rotor assembly 72 includes a back plate 60 having a first side 62 facing the motor case 16 and a second side 64 facing the gear case 14. A plurality of blades 66 extend axially outwardly from first side 62 of the back plate 60. Blades 64 rotate with the rotor shaft 44 to generate an air flow as previously discussed. When motor 28 is fully assembled, fan 37 is located at or outside an open end of the motor housing 28 with a baffle 330 arranged between the stator assembly 70 and the fan 37. The baffle 330 guides the flow of air from the blades 64 towards the exhaust vents 58.

In an embodiment, stator assembly 70 includes a generally cylindrical lamination stack 80 having center bore to receive the rotor assembly 72. Lamination stack 80 further includes a plurality of stator teeth extending inwardly from a stator ring towards the center bore. The stator teeth define a plurality of slots therebetween configured. A plurality of coil windings 86 are wound around the stator teeth into the slots. A series of motor terminals 104 are arranged in electrical connection with the windings 86.

In an embodiment, power module 100 is secured to another end of the motor housing 29. Power module 100 includes positional sensors arranged to be positioned in close proximity to the sense magnet ring 324 to sense a rotational position of the rotor assembly 72. Power module 100 additionally includes power switches that regulate supply of power to the motor windings 86. Since power switches generate significant amount of heat, power module 100 further includes a heat dissipation component (e.g., a heat sink) for effective thermal transfer from the power switches.

Power module 100 will be described herein with reference to FIGS. 6-11, according to a first embodiment. An alternative power module 200 will be described later in this disclosure with reference to FIGS. 12-15, according to a second embodiment.

Figure 6:
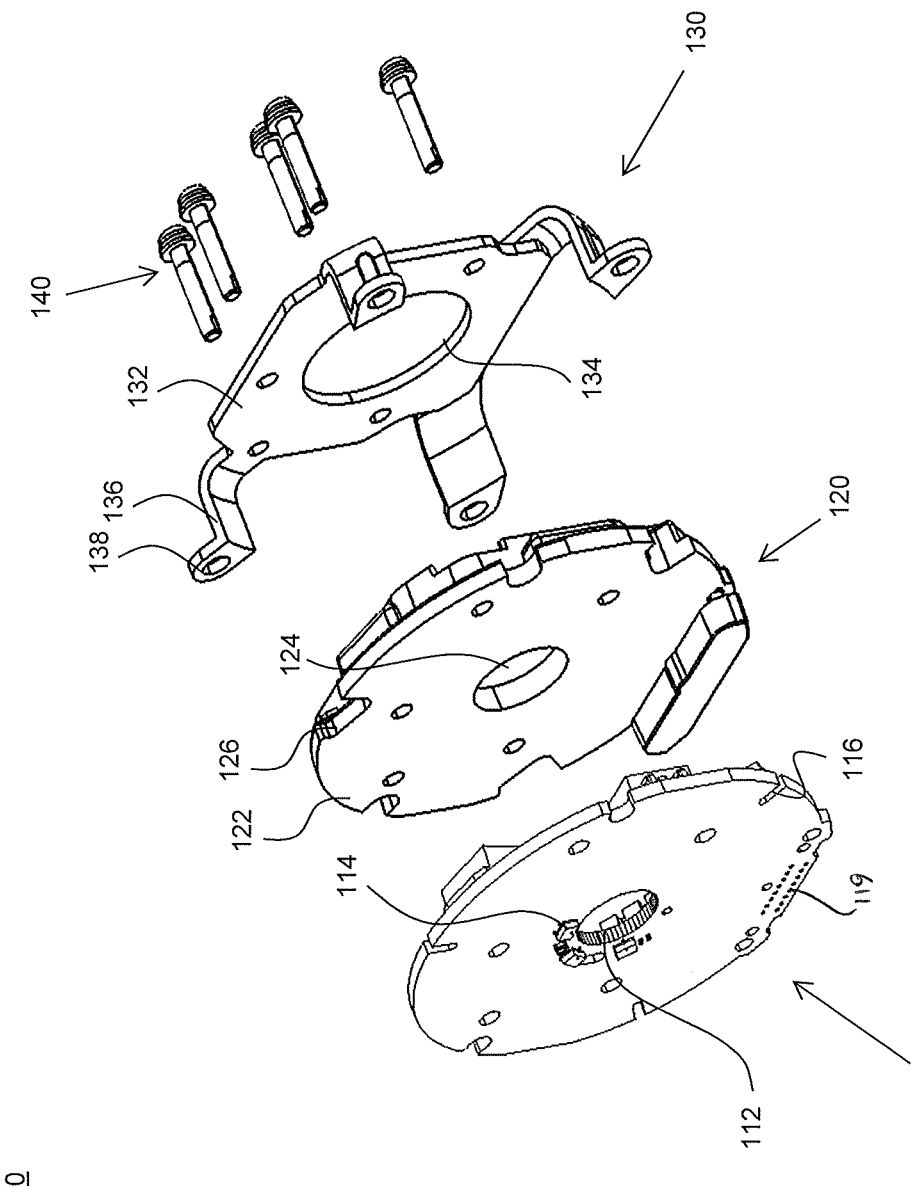
FIGS. 6 and 7 depict perspective exploded views of a power module, in accordance with a first embodiment.
Figure 7:
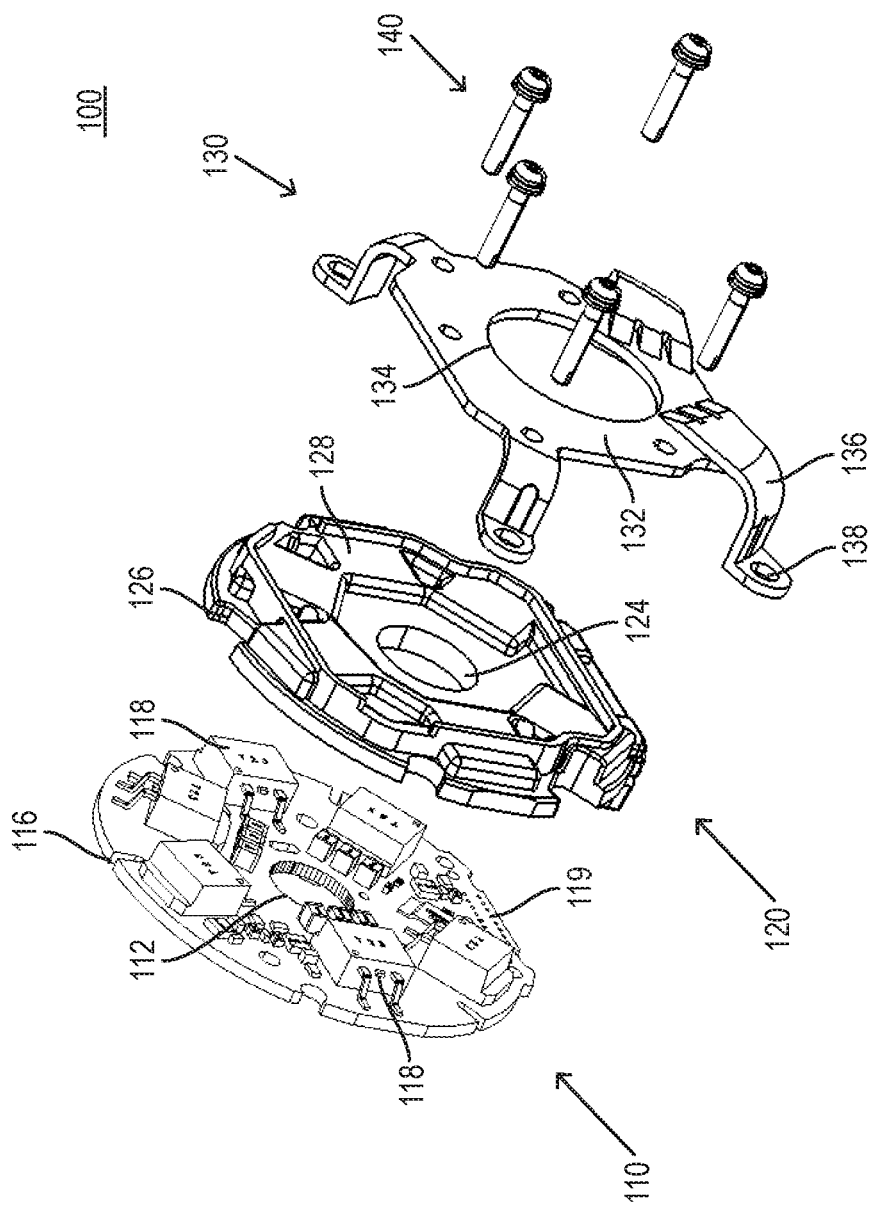
Figure 9:
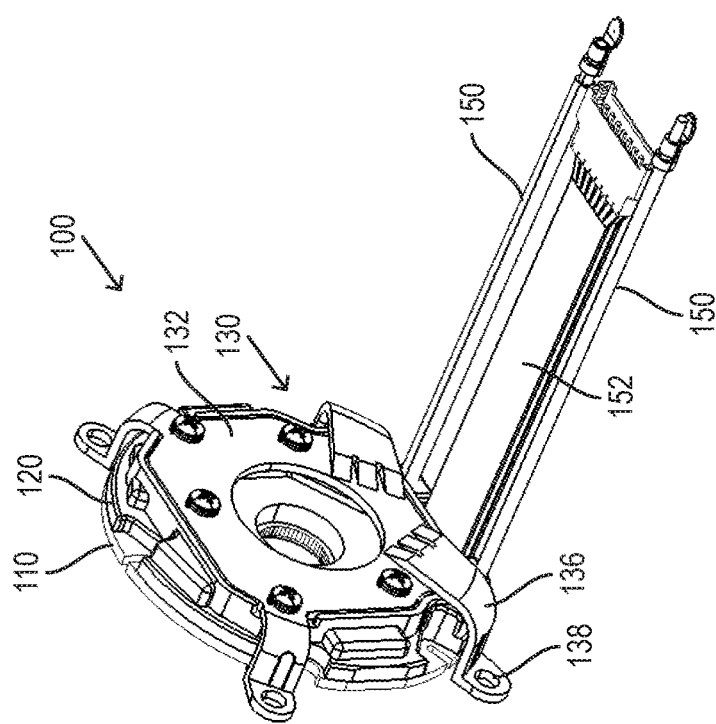
FIGS. 8 and 9 depict perspective views of the power module, in accordance with the first embodiment.
Figure 8:
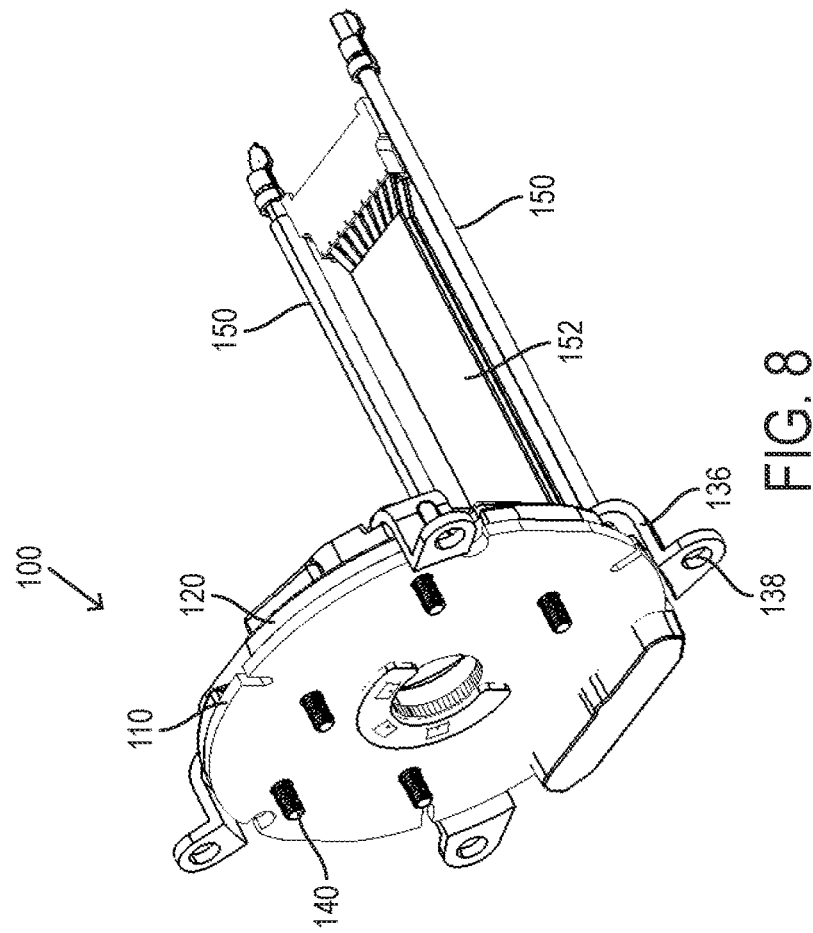

FIGS. 6 and 7 depict exploded views of power module 100, according to the first embodiment. FIGS. 8 and 9 depict perspective views of power module 100, according to the first embodiment.

As shown herein, in an embodiment, power module 100 includes a power circuit board 110, an overmold layer 120, and a clamping heat sink 130. These components are secured to one another via a series of fasteners 140.

Power module 100 may be disc-shaped to match the cylindrical profile of the motor 28. Additionally, power module 100 may define a center through-hole (i.e., through hole 112 in power circuit board 110, through-hole 124 in overmold layer 124, and through-hole 134 in clamping heat sink 130) to accommodate the rotor shaft 44 in some embodiments.

In an embodiment, power board 110 includes a generally disc-shaped printed circuit board (PCB) with six power switches 118 that power the stator windings 86 of the motor 28, such as MOSFETs and/or IGTBs, on a first surface thereof. Power switches may be configured as a three-phase inverter circuit. Examples of such a circuit may be found in US Patent Publication No. 2013/0342144, which is incorporated herein by reference in its entirety. Power board 110 may additionally include other circuitry such as the gate drivers, bootstrap circuit, and all other components needed to drive the power switches 118.

In addition, power board 110 includes a series of positional sensors (e.g., Hall sensors) 114 on a second surface thereof facing the motor housing 29.

In an embodiment, power circuit board 110 is electrically coupled to a power source (e.g., a battery pack) via power lines 150 connected to a series of board terminals 119 for supplying electric power to the power switches 118. Power circuit board 110 is also electrically coupled to a controller (e.g., inside control unit 11 in FIG. 2) via control signals (e.g., a ribbon connector) 152 for communicating data regarding the control of the power switches 118 as well as positional information sensed by the positional sensors 114.

In an embodiment, power circuit board 110 includes peripheral slots 116 for receiving and electrically connecting to the motor terminals 104. In an embodiment, slots 298 may be defined and spread around an outer periphery of the power circuit board 110.

Power switches 118 generate a substantial amount of heat that need to be transferred away from the power module 110 in an effective manner. In an embodiment, to provide thermal transfer from the power switches 118, the power circuit board 110 is an insulated metal substrate (IMS) board. As such, power circuit board 110 includes a highly thermally-conductive conductive core carrier (e.g., aluminum) on its second surface facing the motor housing 29, another conductive layer such as a copper foil layer on its first surface on which the power switches 118 are mounted and masked to form copper routings, and a thin layer of insulating material (e.g., polymer and/or ceramic) disposed between the two conductive layers. The layer of insulating material may be thermally-conductive but electrically insulating. The metal carrier is thus in thermal communication with the power switches 118. The metal carrier faces the motor housing 29, and is within the path of the airflow generated by the motor fan 60. Accordingly, the metal carrier effectively carries heat away from the power switches 118 to the airflow.

Figure 10:
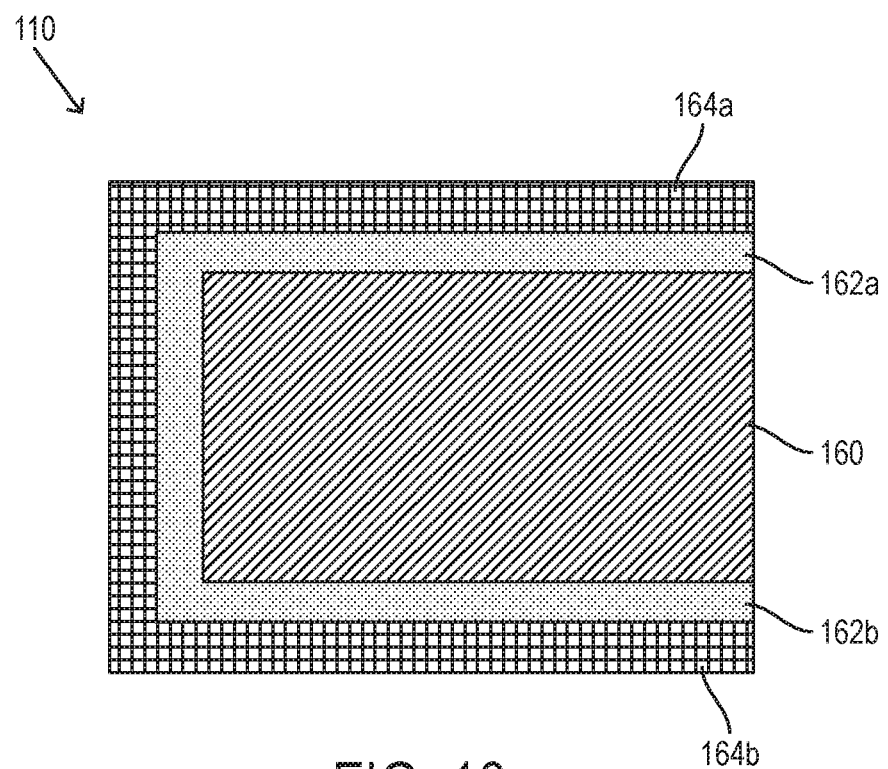
FIG. 10 depicts a cross-sectional view of an insulated-metal substrate power circuit board, according to an embodiment.

In an embodiment, the power circuit board 110 is a double-layer aluminum core IMS board, as shown in FIG. 10. In this example, power circuit board 110 includes a conductive core carrier 160 made of, for example, aluminum or aluminum alloy, having a thickness of 1-2 mm; an insulating layer 162a, 162b, made of, for example, FR-4 epoxy laminate material, having a thickness of 0.05-0.2 mm; and a copper foil layer 164a, 164b, having a thickness of 0.01-0.05 mm.

In an embodiment, the copper foil layer 164a, 164b is masked using a solder mask (not shown) and etched to obtain the desired conductive traces on top of the insulating layer 162a, 162b. The power switches 118 and other circuit components are then mounted in contact with the conductive traces. The circuit board 110 may additionally include a layer of lacquer conformal coating (not shown) and/or a silkscreen.

Figure 11:
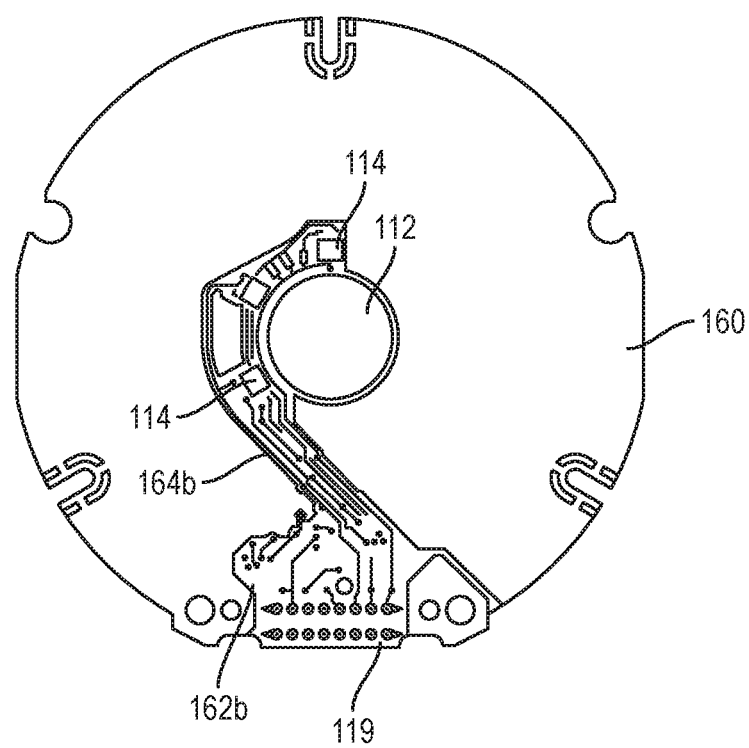
FIG. 11 depicts an axial view of a surface of the power circuit board facing the motor, according to an embodiment.

FIG. 11 depicts a view of the second surface of the circuit board 110. In an embodiment, the second surface of the circuit board 110 is divided into two regions. Within a first region, the copper foil layer 164b is masked and etched as described above to obtain the desired conductive traces between the mounting location of the positional (hall) sensors 114 and the board terminals 119. Positional sensors 114 are then mounted within this region around the though-hole 112 in contact with the conductive traces. An additional layer of lacquer conformal coating and/or silkscreen may further be applied.

In an embodiment, within a second region of the second surface of the circuit board 11, substantially all the copper foil layer 164b and the insulating layer 162b are masked and etched and removed to expose the conductive core layer 160 on the second surface of the circuit board. In an embodiment, the second region of the second surface that exposes the conductive layer 160 has a surface area that is at least 70%, and preferably 80%, of the total surface area of the second surface of the circuit board 110.

In an alternative embodiment, the first region of the second surface of the circuit board 110 as described above is provided with an insulating layer 162b and the copper coil layer 164b for mounting and routing of the positional sensors 114, and the second region of the second surface of the circuit board 110 is provided without these layers to expose the aluminum core layer 160. Thus, masking and etching of the copper coil layer 164b is performed only within the first region, and there is no need to mask and etch the copper coil layer 164b and the insulating layer 162b within the second region.

In yet another embodiment, power circuit board 110 is a single-layer aluminum core IMS board with the aluminum core layer as its base. In this embodiment, on the second surface of the circuit board 110, layers of insulating material and copper may be applied as needed within the first region on and between the mounting area of the positional sensors 114 and the board terminals 119. Thus, once again, there is no need to mask and etch the copper coil layer 164b and the insulating layer 162b within the second region.

Referring back to FIGS. 6-9, in an embodiment, overmold layer 120 is applied to cover the first and parts of the second surface of the circuit board 110. In an embodiment, the overmold layer 120 forms contoured surfaces 128 around the power switches 118 on the first surface of the circuit board 110 to protect the power switches 118 and other components from contamination. In an embodiment, the overmold layer 120 may also partially cover the copper routings between the positional sensors 114 and the board terminals 119 within the first region of the second surface of the circuit board. The overmold layer 120 forms a central through-hole 124 and peripheral slots 126 corresponding to through-hole 112 and slots 116 of the circuit board 110.

In an embodiment, clamping heat sink 130 is additionally provided for more enhanced heat dissipation. Clamping heat sink 130 includes a main body 132 having a central through-hole 134, and four peripheral legs 136 projecting at an angle from the main body 132 toward the motor housing 29. The end of each peripheral leg 136 includes a through-hole 138 arranged to receive a fastener (not shown) for fastening the power module 100 to the end of the motor housing 29. Additionally, the main body 132 and the circuit board 110 includes corresponding through-holes arranged to receive fasteners 140 for fastening the components of the power module 100 together.

In an embodiment, contoured surfaces 128 of the overmold layer 120 are provided with appropriate thickness to allow thermal communication between the clamping heat sink 130 and power switches 118. Clamping heat sink 130 thus provides two functions: it structurally supports the power module 100 with respect to the motor housing 29, and it provides an additional heat dissipation means for the power switches 118.

An alternative power module 200 will be described later in this disclosure with reference to FIGS. 12-15, according to a second embodiment.

Figure 13:
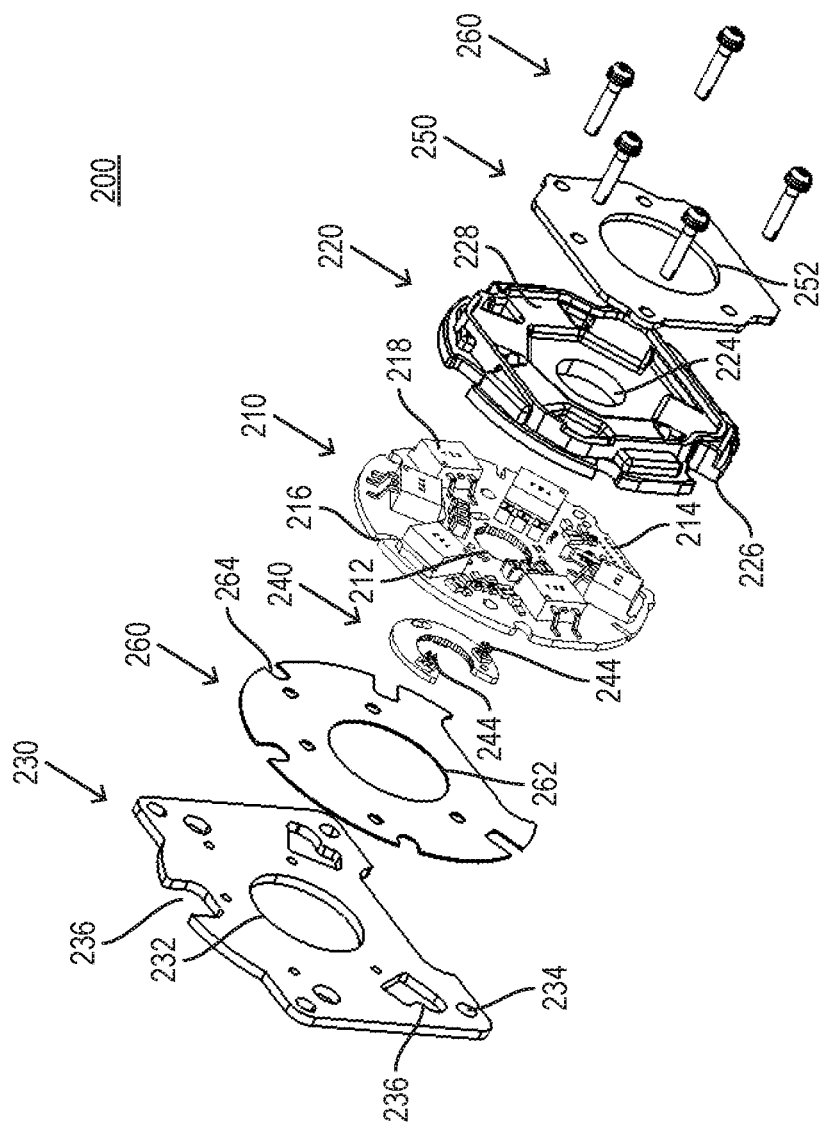
Figure 15:
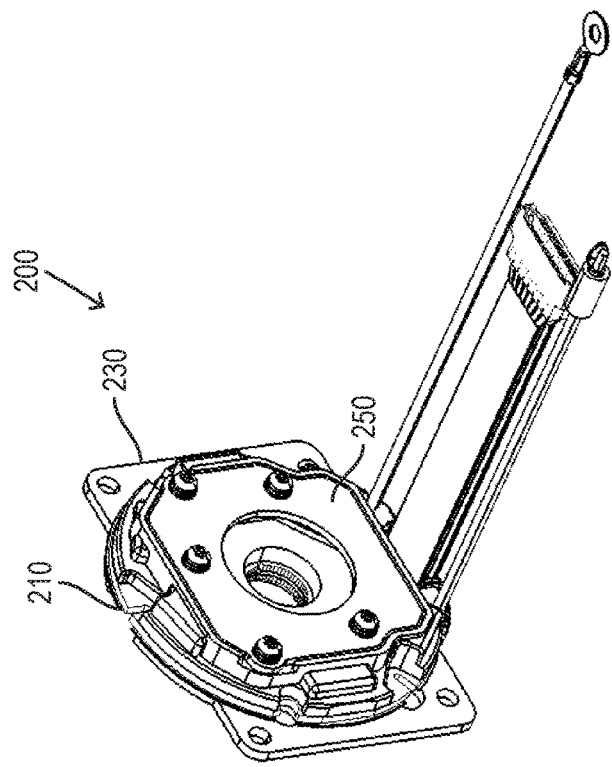
FIGS. 14 and 15 depict perspective views of the power module, in accordance with the second embodiment.
Figure 14:
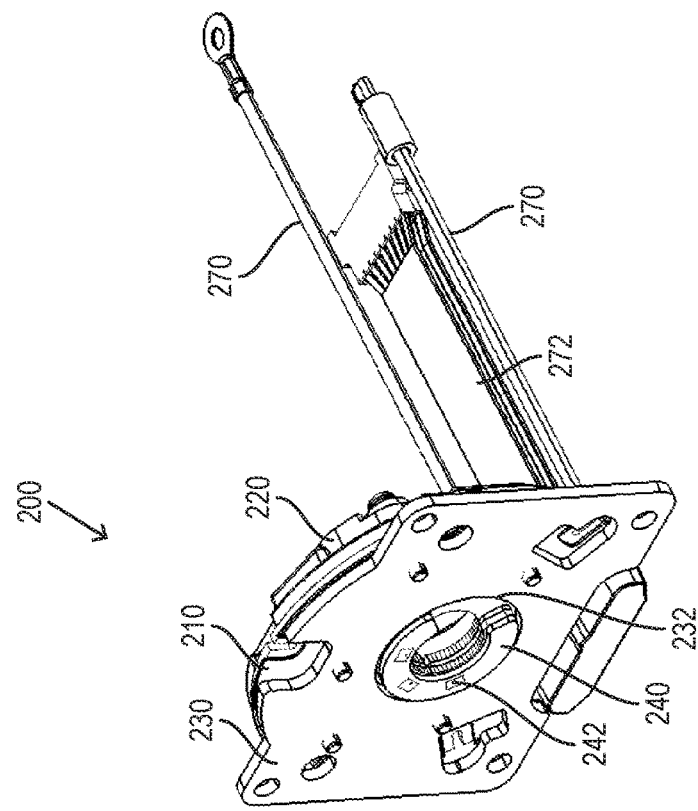

FIGS. 12 and 13 depict perspective exploded views of power module 200, in accordance with an embodiment. FIGS. 14 and 15 depict perspective views of the power module 200, in accordance with an embodiment. As shown herein, in an embodiment, power module 200 includes a power board 210, a thermal interface 260, and a heat sink 230, which attaches to the rear end of the motor housing 29 via a series of fasteners (not shown). Power module 200 may be further provided with a clamp ring 250 that acts to clamp and cover the power board 210 and act as a secondary heat sink, and an overmold layer 220. In an embodiment, a positional sensor board 240 is additionally provided in electrical communication with the power module 200 for detecting a rotational position of the rotor 72.

Power circuit board 210 may be disc-shaped to match the cylindrical profile of the motor 28. Additionally, power circuit board 210 may define a center through-hole 212 to receive the rotor shaft 44 therethrough in some embodiments. In an embodiment, corresponding through-holes 252, 224, 262 and 232 are similarly centrally disposed through the clamp ring 250, overmold layer 220, thermal interface 260, and heat sink 280, to enable the power module 200 to receive the rotor shaft 44 therein.

In an embodiment, power board 210 includes six power switches 218 that power the stator windings 86 of the motor 28, such as MOSFETs and/or IGTBs, mounted on a first surface thereof. Power board 210 may additionally include other circuitry such as the gate drivers, bootstrap circuit, and all other components needed to drive the MOSFETs and/or IGTBs.

In an embodiment, power board 210 is electrically coupled to a power source (e.g., a battery pack) via power lines 270 coupled to a series of board terminals 214. Board terminals 214 of the power board 210 is also electrically coupled to a controller (e.g., inside control unit 11 in FIG. 2) via control signals (e.g., a ribbon connector) 272 for communicating data regarding the control of the power switches 218, as well as positional information sensed by the positional sensor board 240.

The power switches 216 may be configured, for example, as a three-phase bridge driver circuit including three high-side and three low-side transistors connected to drive the three phases of the motor 28, with the gates of the power switches 216 being driven by the control signals from the board terminals 214. Examples of such a circuit may be found in US Patent Publication No. 2013/0342144, which is incorporated herein by reference in its entirety. In an embodiment, power board 210 further includes peripheral slots 216 for receiving and electrically connecting to the input terminals 104 of the motor 28. In an embodiment, slots 216 may be formed around an outer periphery of the power board 210. The outputs of the transistors bridge driver circuit is coupled to the motor 28 phases via the input terminals 104. In an embodiment, heat sink 230 includes a series of peripheral slots and/or openings 236 corresponding to the peripheral slots 216 to allow passage of the input terminals 104 into the slots 216. In an embodiment, thermal interface 260 includes similar slots 264.

In an embodiment, heat sink 280 is provided on the second surface of the power board 210 to transfer heat away from the power switches 216. In an embodiment, heat sink 280 is generally disc-shaped, square-shaped, or rectangular-shaped, with a generally-planer body having a substantially flat surface facing the power board 210 and extending parallel thereto. The second surface of the heat sink 210 may also be flat, as depicted herein, though this surface may be provided with fins to increase the overall surface area of the heat sink 280. The size and width of the heat sink 280 may vary depending on the power requirements of the tool and thus the type and size of power switches 218 being used. It is noted, however, that for most 60V power tool applications, the width of the heat sink 280 is approximately 1-3 mm. In an embodiment, heat sink 230 includes through-holes 234 arranged to receive a series of fasteners (not shown) for fastening the power module 200 to the end of the motor housing 29.

In an embodiment, thermal interface 260 may be a thin layer made of Sil-Pad® or similar thermally-conductive electrically-insulating material. Thermal interface 260 may be disposed between the heat sink 230 and the power board 210.

In an embodiment, overmold layer 220 is applied to cover the first and parts of the second surface of the circuit board 210. In an embodiment, the overmold layer 220 forms contoured surfaces 228 around the power switches 218 on the first surface of the circuit board 210. In an embodiment, the overmold layer 220 may partially cover a gap between the positional sensor board 240 and the second surface of the circuit board 210, as described below.

In an embodiment, a series of fasteners 260 are received through corresponding through-holes of the clamping ring 250, overmold element 220, power board 210, thermal interface 260, and fastened into threaded through-holes of the heat sink 230 to secure the components of the power module 200 together.

In an embodiment, positional sensor board 240 includes a C-shaped body on which positional sensors 242 are mounted at set angles with respect to a center of the positional sensor board 240. Alternatively, the positional sensor board 240 may be donut-shaped with a through-hole.

In an embodiment, the positional sensor board 240 is secured to the second surface of the circuit board 210 via two or more legs 244 projecting from a surface of the positional sensor board 240 opposite the mounting surface of the positional sensors 242. Legs 244 structurally support the positional sensor board 240 parallel to and at a distance from the circuit board 210. Additionally, a series of conductive routings passing through one or more of the legs 244 electrically connects the positional sensors 242 to the circuit board 210, which in turn outputs the position signals via the board terminal 214. In an embodiment, the overmold layer 220 substantially occupies the gap between the positional sensor board 240 and the second surface of the circuit board 210.

Alternatively, the positional sensor board 240 is mounted directly on the circuit board 210 with no gap therebetween.

In an embodiment, an inner diameter of the positional sensor board 240 is sized to permit passage of the rotor shaft 44, and is approximately the same size as the through-hole 212 of the circuit board 210. The outer diameter of the positional sensor board 240 is sized to be received within the through-hole 232 of the heat sink 230. In an embodiment, the outer diameter of the positional sensor board 240 is approximately the same size or slightly smaller than the diameter of the through-hole 232 of the heat sink 230.

In comparison to prior art designs in which the positional sensors are mounted on the power circuit board, the arrangement described in this embodiment positions the position sensors to 242 relatively closer to the motor 28. This arrangement thus does not necessitate the motor sense magnet 324 to be positioned within or too close to the through-hole 232 of the heat sink 230. In an embodiment, the surfaces of the positional sensor board 240 and the heat sink 230 facing the motor 28 are disposed substantially along the same plane. Alternatively, in an embodiment, the outer surfaces of the positional sensors 242 lie substantially on the same plane as the surface of the heat sink 230 facing the motor 28.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The invention claimed is:

1. A power tool comprising:
   a tool housing;
   a brushless DC (BLDC) motor disposed within the tool housing, the BLDC motor including a stator assembly and a rotor assembly rotatably interacting with the stator assembly; and
   a power module for driving the BLDC motor, comprising:
     a power circuit board, a plurality of power switches operatively connected to the BLDC motor disposed on a first side of the power circuit board, and a plurality of positional sensors disposed on a side surface of the power circuit board facing the BLDC motor,
     wherein the power circuit board comprises a thermally-conductive core carrier layer, a first electrically-insulating layer disposed on a first surface of the core carrier layer and on which the plurality of power switches are mounted, and a second electrically-insulating layer disposed on a second surface of the thermally-conductive core carrier layer and on which the plurality of positional sensors are mounted, wherein the second electrically-insulating layer is etched to expose the thermally-conductive core carrier layer on at least approximately 70% of a surface area of the side surface of the power circuit board facing the BLDC motor.

2. The power tool of claim 1, wherein the power circuit board further comprises a plurality of terminals disposed on a peripheral side thereof, the second electrically-insulating layer covering an area extending from at least the plurality of positional sensors and the plurality of terminals.

3. The power tool of claim 1, wherein the power circuit board comprises a central through-hole, wherein the power switches are disposed equidistantly around the central through-hole and the positional sensors are disposed circumferentially around the central through-hole.

4. The power tool of claim 1, wherein the thermally-conductive core carrier layer has a thickness of at least approximately 1 mm and the first and second electrically-insulating layers each have a thickness of approximately 0.05 to 0.2 mm.

5. The power tool of claim 1, wherein the power module further comprises a clamping heat sink having a main body disposed over the plurality of power switches and a plurality of legs extending around the power circuit board and mounted to the BLDC motor.

6. The power tool of claim 5, further comprising an overmold layer formed between the power circuit board and the clamping heat sink.

7. The power tool of claim 6, wherein the overmold layer further covers metal routings between the positional sensors on the second surface of the thermally-conductive core carrier layer.

8. The power tool of claim 1, wherein the first electrically-insulating layer is not etched, but the second electrically-insulating layer is etched to expose the thermally-conductive core layer only on the side surface of the power circuit board facing the BLDC motor.

9. A power tool comprising:
a tool housing;
a brushless DC (BLDC) motor disposed within the tool housing, the BLDC motor including a stator assembly and a rotor assembly rotatably interacting with the stator assembly; and
a power module for driving the BLDC motor, comprising:
 a power circuit board having a central through-hole;
 a plurality of power switches operatively connected to the BLDC motor disposed on a first surface of the power circuit board around the central through-hole;
 a positional sensor board mounted on a second surface of the power circuit board facing the BLDC motor, the positional sensor board having a main body formed around the central through-hole;
 a plurality of positional sensors mounted on the positional sensor board facing the BLDC motor; and
 a planar heat sink in surface contact with the second surface of the power circuit board.

10. The power tool of claim 9, wherein the planar heat sink includes an opening having a larger circumference that a circumference of the positional sensor board to allow the positional sensor board to be positioned within the opening in radial alignment with the planar heat sink.

11. The power tool of claim 9, wherein the planar heat sink includes a through-hole having a larger inner diameter than the central through-hole of the power circuit board.

12. The power tool of claim 11, wherein the main body of the positional sensor board includes an outer diameter sized to be fitted within the through-hole of the planar heat sink.

13. The power tool of claim 9, wherein the main body of the positional sensor board includes an inner diameter that is approximately equal to a diameter of the central through-hole of the power circuit board.

14. The power tool of claim 9, wherein the main body of the positional sensor board includes a C-shaped profile.

15. The power tool of claim 9, wherein the positional sensor board is supported at a distance from the second surface of the power circuit board via a plurality of legs.

* * * * *